US010686452B2

(12) United States Patent
Deng et al.

(10) Patent No.: US 10,686,452 B2
(45) Date of Patent: *Jun. 16, 2020

(54) DIGITAL PHASE LOCKED LOOP FOR LOW JITTER APPLICATIONS

(71) Applicant: INTERNATIONAL BUSINESS MACHINES CORPORATION, Armonk, NY (US)

(72) Inventors: Jingdong Deng, Essex Junction, VT (US); Rupert Shiu Chung Ho, Essex Junction, VT (US); David Flye, Milton, VT (US); Zhenrong Jin, Essex Junction, VT (US); Ramana M. Malladi, South Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/013,236

(22) Filed: Jun. 20, 2018

(65) Prior Publication Data
US 2018/0316357 A1 Nov. 1, 2018

Related U.S. Application Data

(60) Continuation of application No. 15/820,701, filed on Nov. 22, 2017, now Pat. No. 10,084,460, which is a
(Continued)

(51) Int. Cl.
*H03L 7/087* (2006.01)
*H03L 7/099* (2006.01)
*G06F 30/30* (2020.01)

(52) U.S. Cl.
CPC .............. *H03L 7/087* (2013.01); *G06F 30/30* (2020.01); *H03L 7/0991* (2013.01);
(Continued)

(58) Field of Classification Search
CPC ......... H03L 7/0891; H03L 7/18; H03L 7/093; H03L 7/087; H03L 7/10
(Continued)

(56) References Cited

U.S. PATENT DOCUMENTS

| 5,495,512 A | 2/1996 | Kovacs |
| 6,081,165 A | 6/2000 | Goldman |

(Continued)

FOREIGN PATENT DOCUMENTS

| EP | 0299724 | 1/1989 |
| EP | 1443653 | 8/2004 |

OTHER PUBLICATIONS

List of IBM Patents or Patent Applications Treated as Related' 1 page.
(Continued)

*Primary Examiner* — Lincoln D Donovan
*Assistant Examiner* — Diana J. Cheng
(74) *Attorney, Agent, or Firm* — Alvin Borromeo; Andrew M. Calderon; Roberts Calderon Safran & Cole, P.C.

(57) ABSTRACT

A phase locked loop circuit is disclosed. The phase locked loop circuit includes a ring oscillator. The phase locked loop circuit also includes a digital path including a digital phase detector. The phase locked loop circuit further includes an analog path including a linear phase detector. Additionally, the phase locked loop circuit includes a feedback path connecting an output of the ring oscillator to an input of the digital path and an input of the analog path. The digital path and the analog path are parallel paths. The digital path provides a digital tuning signal the ring oscillator that digitally controls a frequency of the ring oscillator. The
(Continued)

analog path provides an analog tuning signal the ring oscillator that continuously controls the frequency of the ring oscillator.

11 Claims, 12 Drawing Sheets

Related U.S. Application Data continuation of application No. 15/248,792, filed on Aug. 26, 2016, now Pat. No. 9,917,591, which is a division of application No. 14/245,374, filed on Apr. 4, 2014, now Pat. No. 9,455,728.

(52) U.S. Cl.
CPC .......... *H03L 7/0995* (2013.01); *H03L 7/0997* (2013.01); *H05K 999/99* (2013.01); *H03L 2207/06* (2013.01); *H03L 2207/50* (2013.01)

(58) Field of Classification Search
USPC .................................................. 327/144–159
See application file for complete search history.

(56) References Cited

U.S. PATENT DOCUMENTS

| | | | |
|---|---|---|---|
| 6,803,831 B2 | 10/2004 | Nishikido | |
| 6,891,442 B2 | 5/2005 | Allen et al. | |
| 7,177,611 B2 | 2/2007 | Goldman | |
| 7,180,794 B2 | 2/2007 | Matsue | |
| 7,408,415 B2 | 8/2008 | Dielt et al. | |
| 7,679,454 B2 | 3/2010 | Kuan et al. | |
| 7,791,417 B2 | 9/2010 | Wang et al. | |
| 7,840,199 B2 | 11/2010 | Krishnaswamy et al. | |
| 8,031,008 B2 | 10/2011 | Wang et al. | |
| 8,031,011 B2 | 10/2011 | Moussavi et al. | |
| 8,040,196 B2 | 10/2011 | Shin | |
| 8,111,798 B2 | 2/2012 | Sai | |
| 8,222,936 B2 | 7/2012 | Friedman et al. | |
| 8,952,759 B2 * | 2/2015 | Wang | H03K 3/0315 327/150 |
| 9,455,728 B2 | 9/2016 | Deng et al. | |
| 9,806,723 B2 | 10/2017 | Deng et al. | |
| 9,819,350 B2 | 11/2017 | Deng et al. | |
| 9,906,228 B2 | 2/2018 | Deng et al. | |
| 9,917,591 B2 | 3/2018 | Deng et al. | |
| 2006/0001496 A1 | 1/2006 | Abrosimov et al. | |
| 2007/0152763 A1 | 7/2007 | Mansuri | |
| 2008/0284529 A1 | 11/2008 | Refeld et al. | |
| 2009/0174491 A1 | 7/2009 | Wang et al. | |
| 2011/0169580 A1 | 7/2011 | Dodrill | |
| 2012/0313676 A1 | 12/2012 | Nguyen et al. | |
| 2013/0069700 A1 | 3/2013 | Wang et al. | |
| 2013/0113528 A1 | 5/2013 | Frantzeskakis et al. | |
| 2013/0181756 A1 | 7/2013 | Ballantyne et al. | |
| 2013/0187764 A1 | 7/2013 | Smith | |
| 2015/0162921 A1 | 6/2015 | Chen et al. | |
| 2015/0288370 A1 | 10/2015 | Deng et al. | |
| 2015/0372682 A1 | 12/2015 | Alexeyev et al. | |
| 2016/0365861 A1 | 12/2016 | Deng et al. | |
| 2016/0365862 A1 | 12/2016 | Deng et al. | |
| 2016/0365863 A1 | 12/2016 | Deng et al. | |
| 2016/0365864 A1 | 12/2016 | Deng et al. | |
| 2017/0338827 A1 | 11/2017 | Deng et al. | |
| 2017/0373695 A1 | 12/2017 | Deng et al. | |
| 2018/0048321 A1 | 2/2018 | Deng et al. | |
| 2018/0083640 A1 | 3/2018 | Deng et al. | |

OTHER PUBLICATIONS

Specification and Drawings "Digital Phase Locked Loop for Low Jitter Applications" for U.S. Appl. No. 16/030,970, filed Jul. 10, 2018, 46 pages.
Kim et al., "PLL/DLL System Noise Analysis for Low Jitter Clock Synthesizer Design", IEEE, 1994, pp. 31-34.
Gupta, Someshwar, "Phase-Locked Loops", Proceedings of the IEEE, vol. 63, No. 2, Feb. 1975, pp. 291-306.
Specification and Drawings "Digital Phase Locked Loop for Low Jitter Applications" for U.S. Appl. No. 15/994,107, filed May 31, 2018, 47 pages.
Notice of Allowance dated Aug. 23, 2018 in related U.S. Appl. No. 15/789,035,16 pages.
Office Action dated Sep. 17, 2018 in related U.S. Appl. No. 15/994,107,16 pages.
Office Action dated Sep. 19, 2018 in related U.S. Appl. No. 16/030,970,15 pages.
Final Office Action dated Feb. 1, 2019 in related U.S. Appl. No. 15/994,107, 18 pages.
Final Office Action dated Feb. 1, 2019 in related U.S. Appl. No. 16/030,970, 15 pages.
Office Action dated Mar. 27, 2019 in related U.S. Appl. No. 16/152,678, 17 pages.
Office Action dated Mar. 27, 2019 in related U.S. Appl. No. 16/152,678, 35 pages.
Office Action dated May 23, 2019 in related U.S. Appl. No. 15/994,107, 13 pages.
Office Action dated Jun. 3, 2019 in related U.S. Appl. No. 16/030,970, 17 pages.
Notice of Allowance dated Oct. 3, 2019 in related U.S. Appl. No. 16/152,678, 7 pages.
Notice of Allowance dated Nov. 21, 2019 in related U.S. Appl. No. 15/994,107, 7 pages.
Final Office Action dated Dec. 4, 2019 in related U.S. Appl. No. 16/030,970, 13 pages.
Notice of Allowance dated Feb. 14, 2020 in related U.S. Appl. No. 15/994,107,13 pages.
Notice of Allowance dated Feb. 11, 2020 in related U.S. Appl. No. 16/030,970, 7 pages.
Office Action dated Apr. 16, 2020 in related U.S. Appl. No. 16/733,669, 9 pages.

* cited by examiner

DIGITAL PHASE LOCKED LOOP FOR LOW JITTER APPLICATIONS

FIELD OF INVENTION

This application relates generally to phase-locked loops (PLLs) and, more particularly, to hybrid ring PLL circuits.

BACKGROUND

A phase-locked loop (PLL) is an electronic circuit with an oscillator having an output that is constantly modified to match the frequency and phase of an input from another oscillator. In a phase-locked loop (PLL), a phase frequency detector compares the phase and frequency of a periodic signal (e.g., a clock) that is output by a variable frequency oscillator to the phase and frequency of a periodic input signal (i.e., a reference signal). Based on the comparison, the PLL adjusts the variable frequency oscillator to establish and maintain a constant phase relationship between the output signal and the input signal. Once the phase difference between the two signals becomes substantially constant, the PLL is said to be "in lock."

SUMMARY

In an aspect of the invention, there is a phase locked loop circuit including a ring oscillator. The phase locked loop circuit also includes a digital path including a digital phase detector. The phase locked loop circuit further includes an analog path including a linear phase detector. Additionally, the phase locked loop circuit includes a feedback path connecting an output of the ring oscillator to the digital path and to the analog path. The digital path and the analog path are parallel paths. The digital path provides a digital tuning signal to the ring oscillator that digitally controls a frequency of the ring oscillator. The analog path provides an analog tuning signal to the ring oscillator that continuously controls the frequency of the ring oscillator.

In further aspects of the invention, there is ring oscillator including oscillator elements. The ring oscillator also includes a digitally-controlled portion configured to change frequency based on a digital input. The ring oscillator further includes a proportionally-controlled portion configured to change frequency based on an analog input. The digital input and analog input are parallel inputs of the ring oscillator.

In further aspects, there is a method in a computer-aided design system for generating a functional design model of a ring oscillator. The method includes generating a functional representation of an array of oscillator elements. The method also includes generating a functional representation of a digitally-controlled device connected to the array and configured to selectively activate a plurality of the oscillator elements based on a digital tuning signal. The method further includes generating a functional representation of one or more proportionally-controlled devices connected to the array and configured to change frequency continuously based on an analog tuning input.

In another aspect of the invention, a design structure tangibly embodied in a machine readable storage medium for designing, manufacturing, or testing an integrated circuit is provided. The design structure comprises structures for a ring oscillator circuit. In further embodiments, a hardware description language (HDL) design structure encoded on a machine-readable data storage medium comprises elements that when processed in a computer-aided design system generates a machine-executable representation of structures for the ring oscillator circuit. In still further embodiments, a method in a computer-aided design system is provided for generating a functional design model of structures for the ring oscillator circuit. The method comprises generating a functional representation of structures for the ring oscillator circuit.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

This application relates generally to phase-locked loops (PLLs) and, more particularly, to hybrid ring PLL circuits. Purely analog PLLs have complicated correction paths and large footprints that consume substantial area on semiconductor chips. Purely digital PLLs (e.g., built with complementary metal oxide semiconductor (CMOS) technology) have many advantages in comparison to analog PLLs, such as small footprints and extensive programmability. However, digital phase frequency detectors provide quantized phase error correction that can result in significantly higher phase jitter than analog PLLs. In accordance with aspects of the invention, there is a digital PLL including an analog correction path that reduces phase jitter while maintaining the advantages of the digital design.

Figure 1:
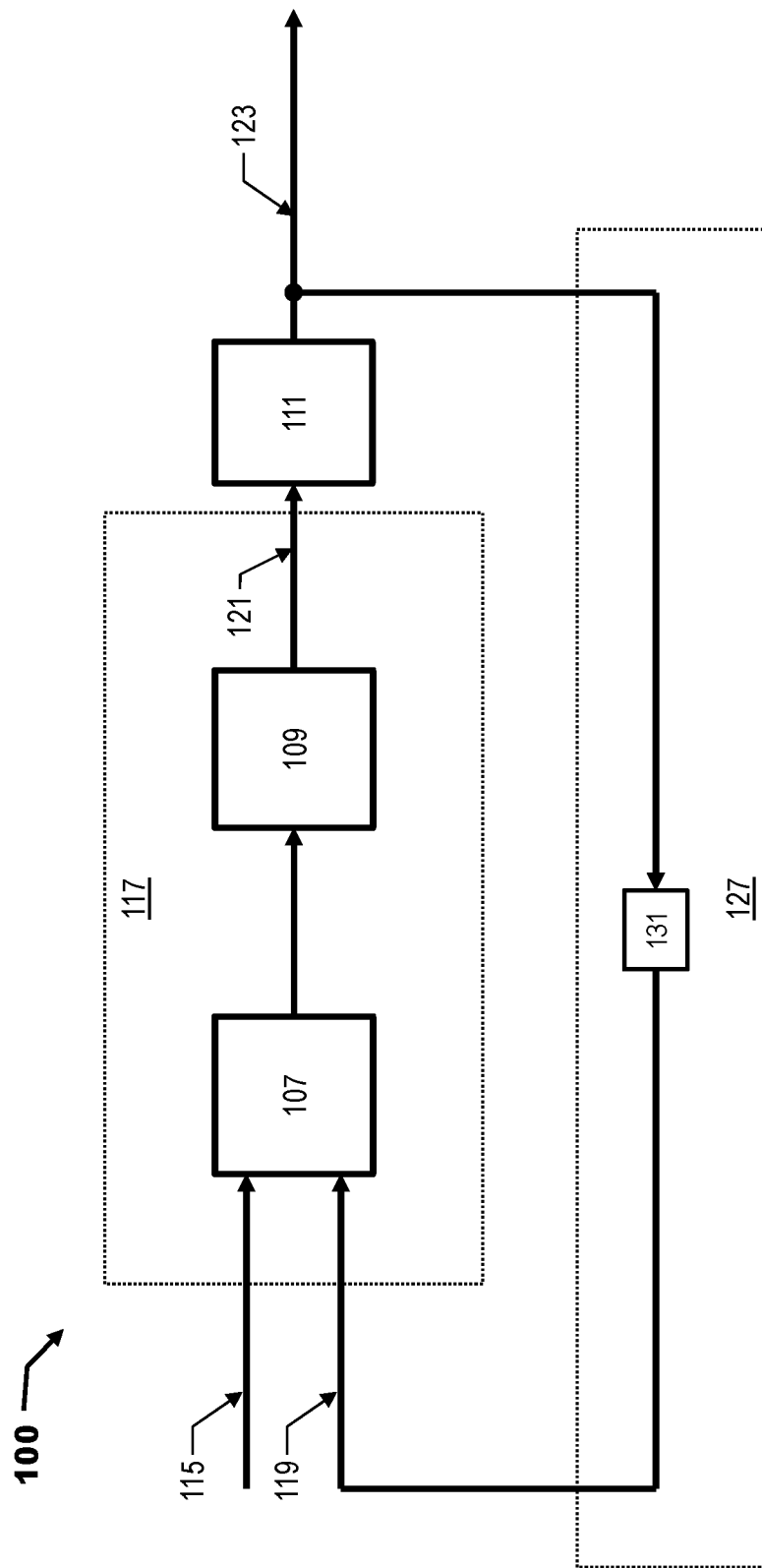
FIG. 1 shows an exemplary all-digital PLL circuit.

FIG. 1 shows an exemplary all-digital PLL circuit 100 including a digital phase detector 107, a filter 109 and digitally controlled oscillator (DCO) 111. The digital phase detector 107 can be a bang-bang phase detector (i.e., an Alexander phase detector). The digital phase detector 107 receives a reference signal 115 and a feedback signal 119, and generates a signal indicating whether the reference signal 115 is leads or trails (i.e., precedes or succeeds) the feedback signal 119. The reference signal 115 can be any type of periodic signal (e.g., a clock signal). The filter 109 integrates the output of the phase detector 107 and produces a digital tuning signal 121, which is a control voltage for the digitally controlled oscillator 111. The digital phase detector 107 and the filter 109 form a digital path 117 between the reference signal 115 and the digitally-controlled oscillator 111. The digitally controlled oscillator 111 generates an output signal 123 having a frequency that depends on the voltage of the digital tuning signal 121. The output signal 123 is fed back to the digital phase detector 107 via feedback path 127 that can include a frequency divider 131, which generates the feedback signal 119.

In comparison to analog PLL circuits, the all-digital PLL circuit 100 has a simple structure and a smaller footprint when incorporated into semiconductor chips. However, the all-digital PLL circuit 100 has disadvantages. For example, the output of the all-digital phase detector 107 is either '0' or '1' for a cycle of the reference signal 115. As such, the phase correction of the all-digital phase detector 107 is not proportional to the phase error between reference signal 115 and feedback signal 119. Further, the all-digital PLL circuit 100 has large phase jitter in comparison to analog PLLs. Moreover, the all-digital phase detector 107 gain is noise dependent such that the dynamic stability of the PLL circuit 100 changes in different noise environments.

Figure 2:
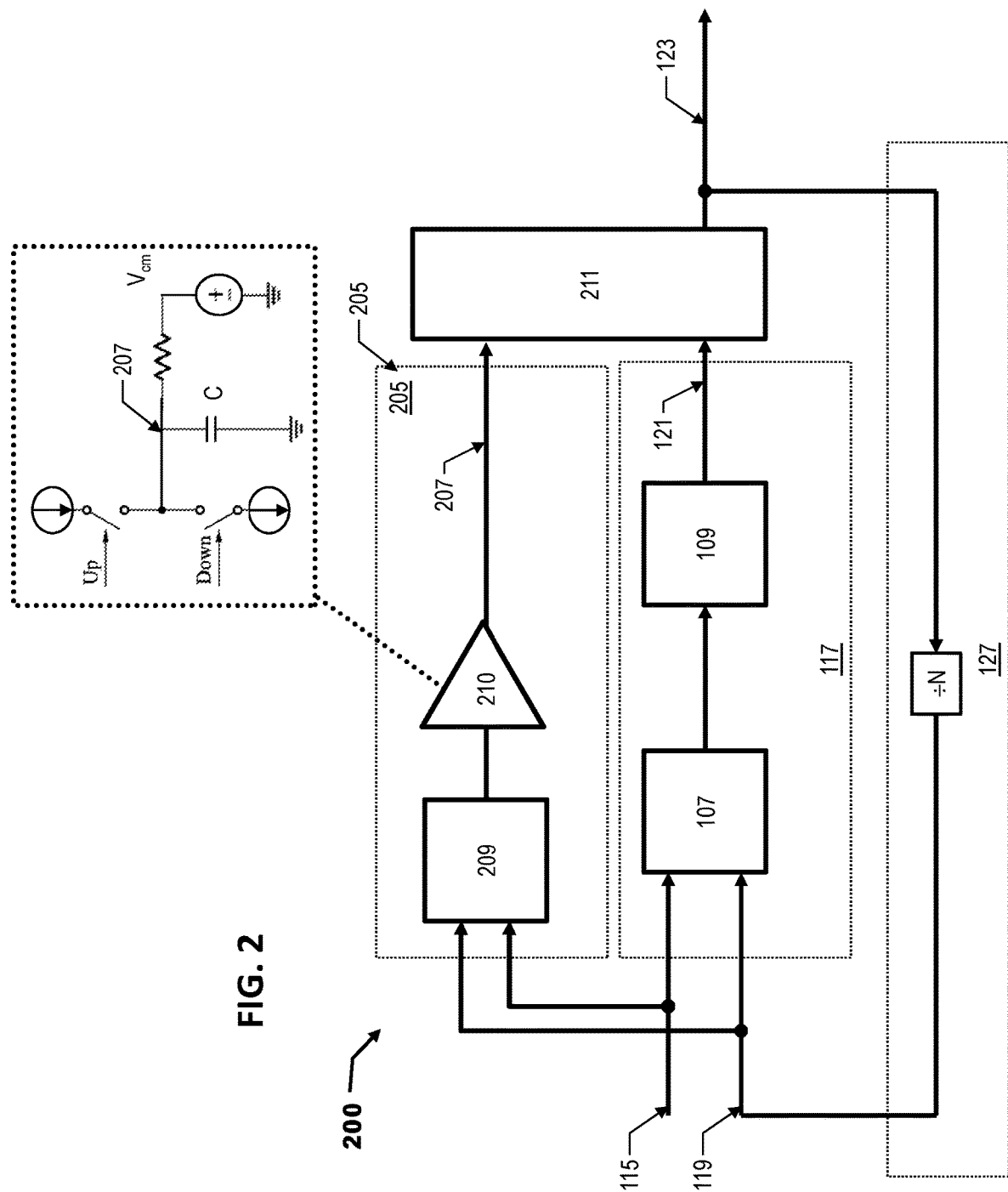
FIG. 2 shows an exemplary hybrid inductor-capacitor ("LC") tank PLL circuit.

FIG. 2 shows an exemplary hybrid LC tank PLL circuit 200. The hybrid LC tank PLL circuit 200 includes the digital path 117 and the feedback path 127, which are substantially the same or similar to those shown in FIG. 1. Additionally, the hybrid LC tank PLL circuit 200 includes an analog path 205 and a LC (inductance-capacitance) oscillator 211. The analog path 205 and the digital path 117 receive the reference signal 115 and the feedback signal 119. Based on those signals, the hybrid LC tank PLL circuit 100 provides an analog tuning signal 207 and the digital tuning signal 121, respectively, as inputs to the LC oscillator 211. The LC oscillator 211 generates the output signal 123. The output signal 123 is fed back to the analog path 205 and the digital path 117 via the feedback path 127.

The analog path 205 includes a linear phase detector 209 and proportional gain device 210. The linear phase detector 209 determines the phase difference between the reference signal 115 and the feedback signal 119. For example, the linear phase detector 209 can include a Hogge phase detector that produces two pulses having widths that modify in relation to the phase difference. The proportional gain device 210 receives the output from the linear phase detector 209 and generates the analog tuning signal 207 having a voltage that is proportional to the phase difference between the reference signal 115 and the feedback signal 119. In embodiments, the proportional gain device 210 receives up and down pulses output from the linear phase detector 209 that are proportional to phase difference between reference signal 115 and feedback signal 119. For example, the up and down pulses control charge pumps which charge or discharge a capacitor device C node inside the proportional gain device 210. $V_{cm}$ is a common mode voltage, which only allows the voltage of the capacitor device C to move around it. The analog tuning signal 207 generated by the proportional gain device 210 is output to the LC oscillator 211 to tune (i.e., modify) the frequency of oscillation.

The output signal 123 produced by the hybrid LC tank PLL circuit 200 includes very low jitter in comparison with an all-digital PLL circuit (e.g., PLL circuit 100). However, the hybrid LC tank PLL circuit 200 is relatively large and costly. As such, the hybrid LC tank PLL circuit 200 is typically used in applications in which low jitter is paramount (e.g., serialization/deserialization), but not in other applications, such as frequency synthesis and clocks.

Figure 3:
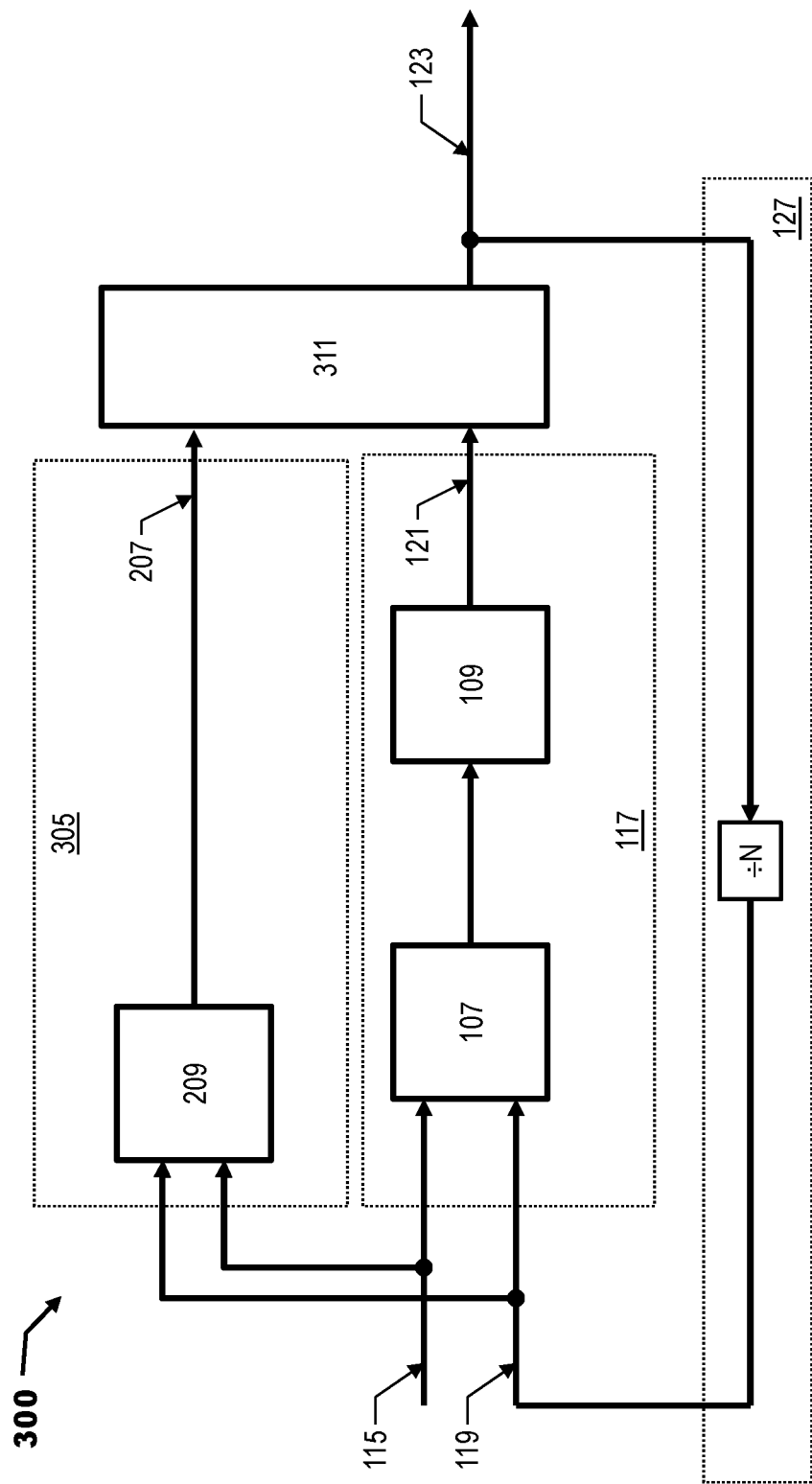
FIG. 3 shows an exemplary hybrid ring PLL circuit in accordance with aspects of the invention.

FIG. 3 shows an exemplary hybrid ring PLL circuit 300 in accordance with aspects of the invention. The hybrid ring oscillator circuit 300 includes the digital path 117, the analog path 305, and the feedback path 127. The digital path 117 and the feedback path 127 that are the substantially the same or similar to those described above with regard to FIGS. 1 and 2. Additionally, the hybrid ring PLL circuit 300 includes a mixed mode controlled ring oscillator 311 (i.e., "ring oscillator"). The digital path 117 and the analog path 205 simultaneously control the frequency of the ring oscillator 311. In accordance with aspects of the invention, the digital path 117 discretely (i.e., digitally) controls the frequency of the ring oscillator 311, and the analog path 205 progressively (i.e., continuously) controls the frequency of the ring oscillator 311.

Figure 4:
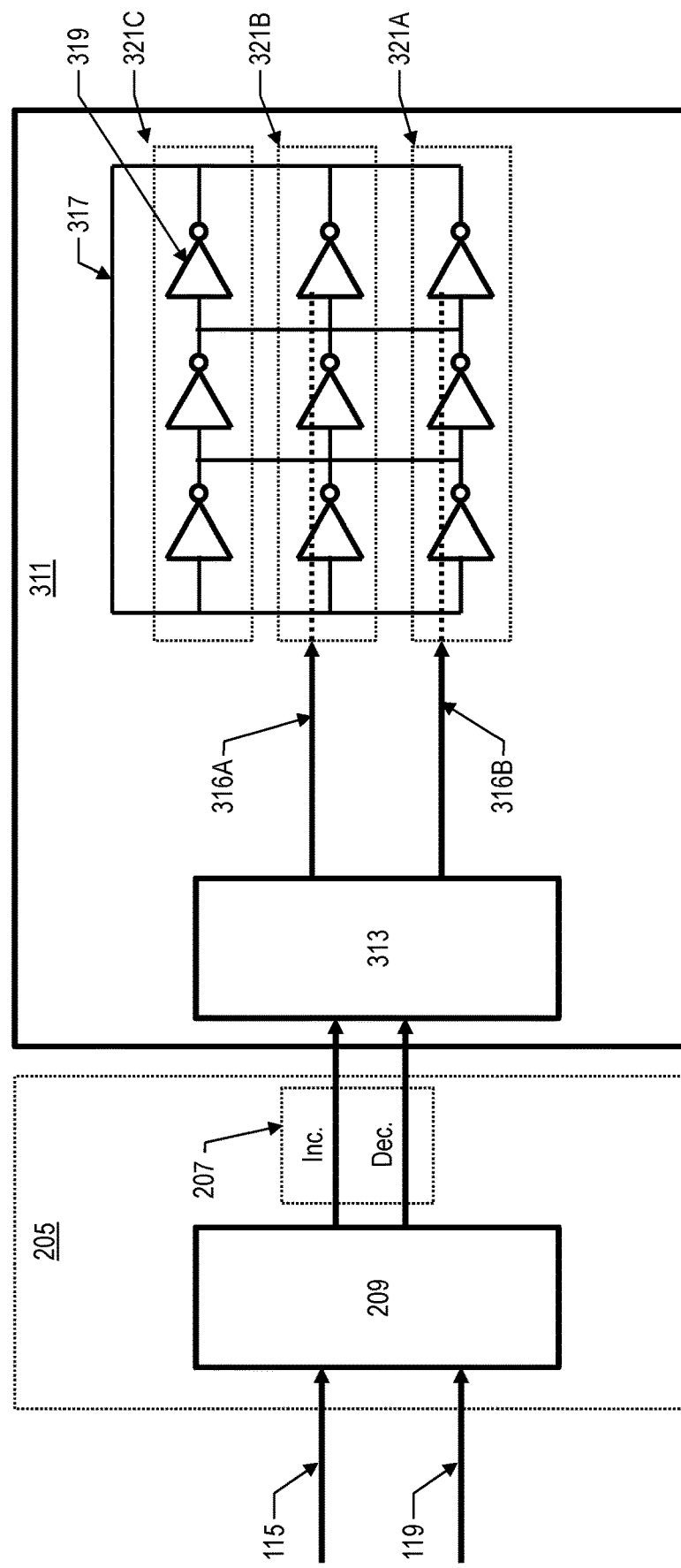
FIG. 4 shows an exemplary analog path and ring oscillator in accordance with aspects of the invention.

FIG. 4 shows the analog path 305 and the ring oscillator 311 of the hybrid ring PLL circuit 300 in accordance with aspects of the invention. In embodiments, the analog path 305 includes the linear phase detector 209, which is the same or similar to that described with respect to FIG. 2. Further, the ring oscillator 311 includes analog control logic 313 and a ring oscillator array 317. The analog control logic 313 is a device including hardware, software, or a combination thereof that determines control signals 316A and 316B for modifying the frequency of the ring oscillator 311 based on the analog tuning voltage 207 output by the linear phase detector 209.

In accordance with aspects of the invention, the ring oscillator array 317 is an array of oscillator elements 319 in which there are three or more rows and three or more columns. While FIG. 3 illustrates the oscillator elements 319 using a conventional symbol for an inverter, the oscillator elements 319 can be inverters, stacked inverters, capacitors, or resistors. In the example shown in FIG. 3, the ring oscillator array 311 is 3-by-3 array. However, embodiments of the invention can use arrays of other sizes.

In accordance with aspects of the invention, two or more of rows 321A, 321B and 321C of the oscillator elements 319 are selectively controlled by the control signals 316A and 316B to turn on/off (i.e., activate/deactivate), thereby changing the frequency at which the ring oscillator 311 oscillates. In embodiments, the analog control logic 313 determines the control signals 316A and 316B based on analog tuning signal 207. The control signal 316A can selectively activate/deactivate a first row 321A of the ring oscillator 311. The control signal 316B can selectively activate/deactivate a second row 321B of the ring oscillator 311. By selectively activating/deactivating the oscillator elements 319 in the ring oscillator 311, the control logic changes the fill factor of the ring oscillator 311. The fill factor is a proportion of active oscillator elements in the ring oscillator 311. Put another way, the fill factor is the ratio of active oscillator elements 319 to the total number of oscillator elements 319 in the array. For example, if the three inverters in row 321A are deactivated, six of the nine oscillator elements 319 in the ring oscillator 311 are active. As such, the fill factor would be 0.67 (i.e., 6/9). The frequency of the of the ring oscillator array 311 increases in proportion to the number of active oscillator elements 319, which modifies the oscillation frequency of the ring oscillator 311.

In accordance with aspects of the invention, the analog control logic 313 receives the analog tuning signal 207 from the linear phase detector 209, which indicates whether to increase or decrease the frequency of the ring oscillator 311 (i.e., whether the reference signal 115 leads or trails the feedback signal 119). Based on the analog tuning signal 207, the analog control logic 313 determines control signal 316A and control signal 316B. If the reference signal 115 and the feedback signal 119 are locked, then the control logic can set control signal 316A and control signal 316B to maintain their current state. For example, in the current state of the ring oscillator 311 set by the control logic, the oscillator elements 319 in row 321A can be "on" and the oscillator elements 319 in row 321B can be "off." As such, to maintain the current frequency of the ring oscillator 311, the analog control logic 313 sets control signal 316A to a high logic state to keep the oscillator elements 319 in row 321A on and sets control signal 316B to a low logic state to keep the oscillator elements 319 in row 321B off. On the other hand, if the reference signal 115 is leading the feedback signal 119, then the analog control logic 313 sets the control signal 316A and the control signal 316 B to a high logic state that activates the oscillator elements 319 in rows 321A and 321B, such that the frequency of the ring oscillator 311 increases. Alternatively, if the reference signal 115 is trailing the feedback signal 119, then the analog control logic 313 sets the control signal 316A and the control signal 316B to a low logic state that deactivates the oscillator elements 319 in rows 321A and 321B, such that the frequency of the ring oscillator 311 decreases.

The embodiment illustrated in FIG. 4 is an example and there are other embodiments consistent with aspects of the invention that provide more granular control of the fill factor. For example, in embodiments, ring oscillator 311 may be a larger array of oscillator elements 319. Additionally or alternatively, embodiments of the analog control logic 313 can generate a greater number of control signals, such as control signals 316A and 316B, which control respective rows of the ring oscillator 311. Further, in embodiments, the control signals can control individual ones of the oscillator elements 319 instead of entire rows.

Figure 5:
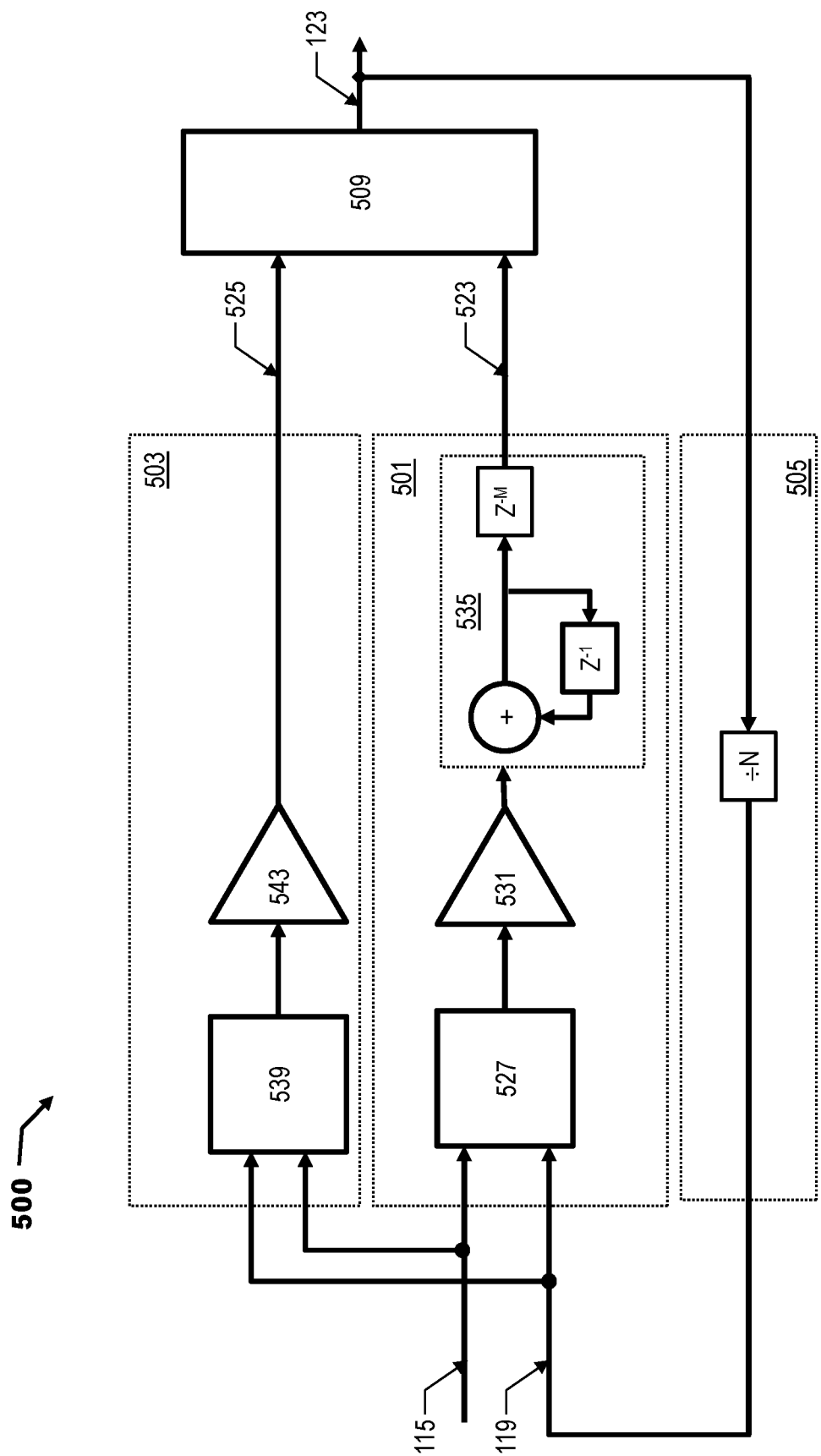
FIG. 5 shows an exemplary hybrid ring PLL circuit in accordance with aspects of the invention.

FIG. 5 shows an exemplary hybrid ring PLL circuit 500 in accordance with aspects of the invention. The hybrid ring PLL circuit 500 includes a digital path 501, an analog path 503, feedback path 505, and a ring oscillator 509 that are arranged in the same or similar manner to those shown in FIG. 2. In accordance with aspects of the invention, the digital path 501 and the analog path 503 are parallel paths that generate a digital tuning signal 523, and an analog tuning signal 525, respectively, which simultaneously control the frequency of the ring oscillator 509. The digital path 501 discretely (i.e., digitally) controls the frequency of the ring oscillator 509, and the analog path 503 progressively (i.e., continuously) controls the frequency of the ring oscillator 509.

In embodiments, the digital path 501 includes a digital phase detector 527, an integral gain device 531, and an integrator 535. The digital phase detector 527 can be the same or similar to that shown in FIGS. 1-4 (i.e., digital phase detector 107). The integral gain device 531 can be, for example, a counter step value, which determines how fast the integrator accumulates. The integrator 535 functions as a filter (e.g., filter 109) that generates the digital tuning signal 523 by smoothing the signals output from the integral gain device 531.

In accordance with aspects of the invention, the analog path 503 includes a linear phase detector 539 and a proportional gain device 543, which can be the same or similar to those shown in FIG. 2 (i.e., linear phase detector 209 and proportional gain device 210). That is, the linear phase detector 539 can determine whether the reference signal 115 leads or lags the feedback signal 119. Based on the determination, the linear phase detector 539 generates one or more outputs that are proportional to the phase difference.

The proportional gain device 543 receives the output from the linear phase detector 539 and generates the analog tuning signal 525 having a voltage that is proportional to the phase difference between the reference signal 115 and the feedback signal 119.

Figure 6:
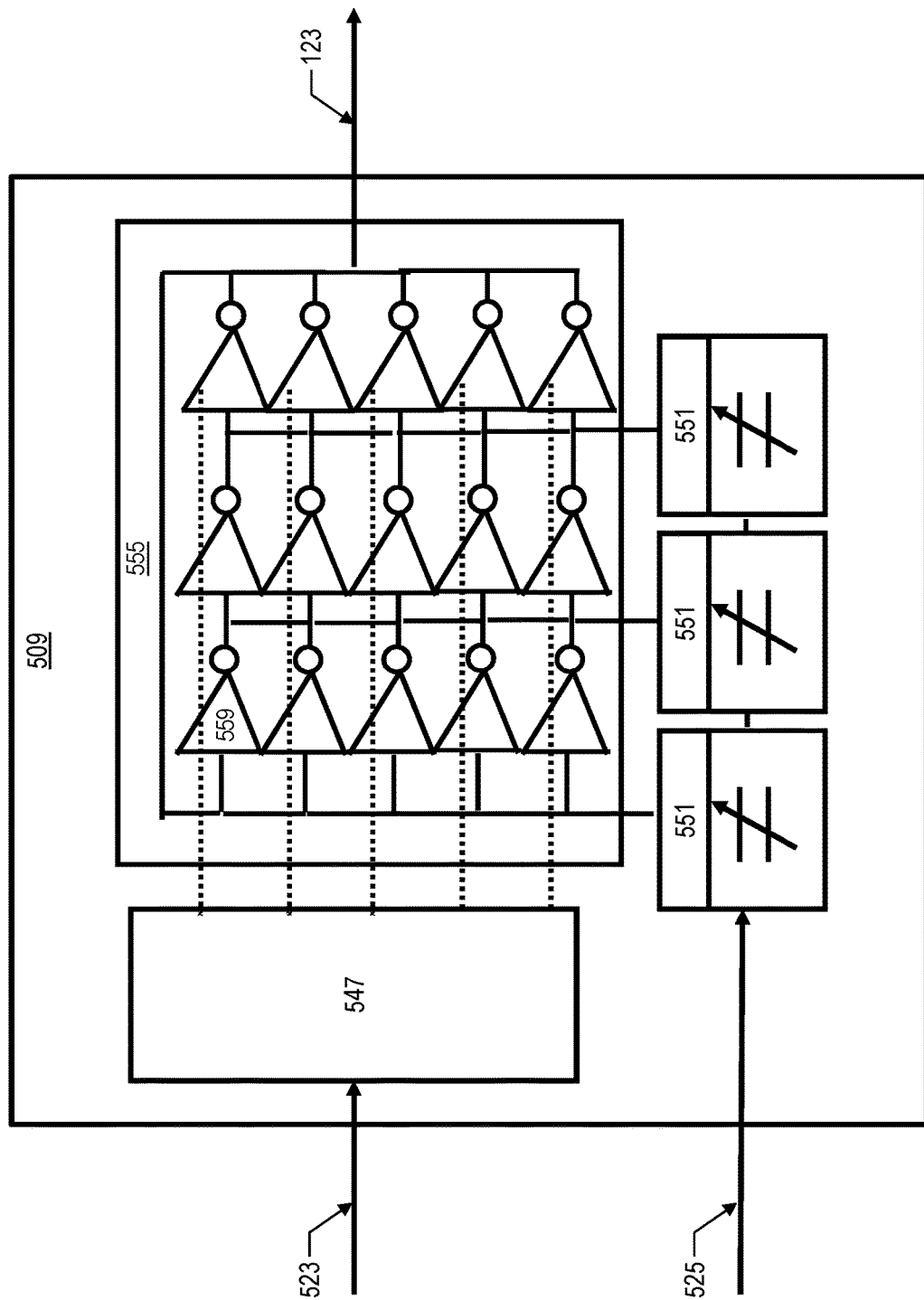
FIG. 6 shows an exemplary hybrid ring oscillator circuit in accordance with aspects of the invention.

FIG. 6 illustrates an exemplary embodiment of the hybrid ring oscillator circuit 509 in accordance with aspects of the invention. In embodiments, the ring oscillator circuit 509 can include digital control logic 547, varactors 551, and a ring oscillator array 555. The ring oscillator array 555 can be similar to that shown in FIG. 4 (i.e., ring oscillator array 317). In the example shown in FIG. 6, the ring oscillator array 555 is 5-by-3 array of oscillator elements 559. However, arrays of other sizes can be used. Also, while FIG. 6 illustrates the oscillator elements 559 using a conventional symbol for an inverter, the oscillator elements 559 can inverters, stacked inverters, capacitors, or resistors.

In accordance with aspects of the invention, the digital control logic 547 discretely modifies the oscillation frequency of the ring oscillator 509 based on the digital tuning signal 523. In embodiments, the digital control logic 547 is a device including hardware, software, or a combination thereof that dynamically controls the fill ratio of the ring oscillator array 555 based the digital tuning signal 523 from the digital path 501. In accordance with aspects of the invention, the digital control logic 547 selectively turns on/off (i.e., activates/deactivates) oscillator elements 559 rows of the ring oscillator array 555 to control the fill factor (i.e., the proportion of active oscillator elements) and, thereby, the frequency of oscillation. For example, the digital tuning signal 523 can include a number of digital logic signals indicating a phase difference between two signals (e.g., reference signal 115 and feedback signal 119). The digital control logic 547 can include logic that interprets digital logic signals and, based on the determination, selectively activates the oscillator elements 559. In embodiments, each output of the digital control logic 547 activates/deactivates a respective row of the ring oscillator 509. Alternatively, the digital control logic 547 can address each oscillator element 559 to activate/deactivate them individually.

In accordance with aspects of the invention, the varactors 551 progressively modify the oscillation frequency of the ring oscillator array 555 based on the analog tuning signal 525. The varactors 551 are voltage-controlled devices having capacitances that are proportional to the analog voltage of analog tuning signal 525 from the analog path 503. According to aspects of the invention, each column of oscillator elements 559 in the ring oscillator array 555 is connected to a respective one of the varactors 551. The capacitance of the varactors 551 loads the oscillator elements 559 of its corresponding column. As the capacitance of the varactors 551 increases due to voltage of the analog tuning signal 525, the frequency of the ring oscillator array 555 decreases. Thus, the frequency of the oscillator ring 509 can be controlled by the analog tuning signal 525.

In accordance with aspects of the invention, the digital tuning signal 523 and the analog tuning signal 525 modify the frequency of the output 123 of the ring oscillator array 555 simultaneously. That is, increasing the voltage of the analog tuning signal 525 (e.g., between 0.0 V and 1.0 V) provides a corresponding shift in the frequency of the ring oscillator array 555. Further, at any given voltage of the digital tuning signal 523, the frequency of the ring oscillator array 555 increases substantially linearly (e.g., from 0 GHz to 40 GHz) in relation to the fill factor (e.g., from 0% to 100%).

Figure 7:
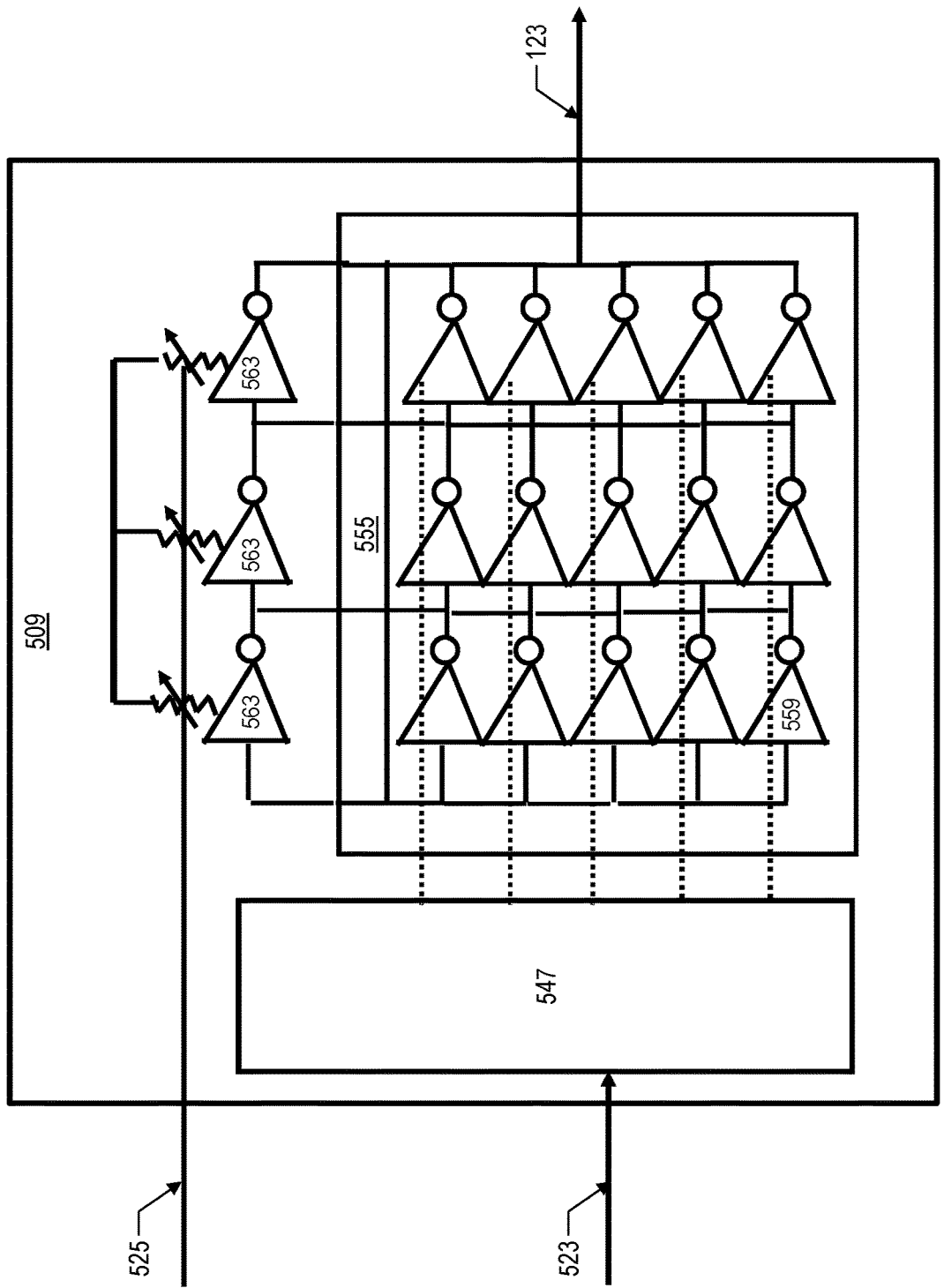
FIG. 7 shows an exemplary ring oscillator circuit in accordance with aspects of the invention.

FIG. 7 illustrates an exemplary embodiment of the hybrid ring oscillator circuit 509 in accordance with aspects of the invention. In embodiments, the ring oscillator circuit 509 can include the digital control logic 547, the ring oscillator array 555, and current-starved inverters 563. The digital control logic 547 and the ring oscillator array 555 can be the same or similar to those shown in FIG. 6.

In accordance with aspects of the invention, the current-starved inverters 563 continuously modify the oscillation frequency of the output 123 of the ring oscillator 509 based on the analog tuning signal 525. In embodiments, the analog tuning signal 525 provides a supply voltage to the current-starved inverters 563 that modifies their supply current in relation to the analog tuning signal 525. For example, as the analog tuning signal 525 decreases, the output voltages of the current-starved inverters 563 decreases proportionally due to reduced supply voltage, which reduces the frequency of the output 123 of the ring oscillator array 555.

In accordance with aspects of the invention, the digital tuning signal 523 and the analog tuning signal 525 modify the frequency of the output 123 of the ring oscillator array 555 simultaneously. As the analog tuning signal 525 increases (e.g., between 0.0 V and 1.0 volts), the frequency of the ring oscillator array 555 increases substantially linearly (e.g., from 0 GHz to 15 GHz). Moreover, as the digital tuning signal 523 increases, the fill factor (i.e., the ratio between the number of "on" oscillator elements 559 and the total number of oscillator elements 559) of the ring oscillator array 555 increases, which shifts the frequency of the frequency of the ring oscillator array 555 higher/lower proportionally. For example, an exemplary implementation of ring oscillator array 555 can have a three-by-three array of inverters, wherein the oscillator elements 559 in the first row of the array are turned off based on the digital tuning signal 523, a second row of the array is turned on based on the digital tuning signal 523, and a third row of the array are current-starved inverters 563. Thus, the fill factor between the number of current staved inverters and the total number of on/off inverters modifies among 0.00, 0.33, 0.50, 0.66, and 1.00, as each row is activated or deactivated by the digital tuning signal 523.

Figure 8:
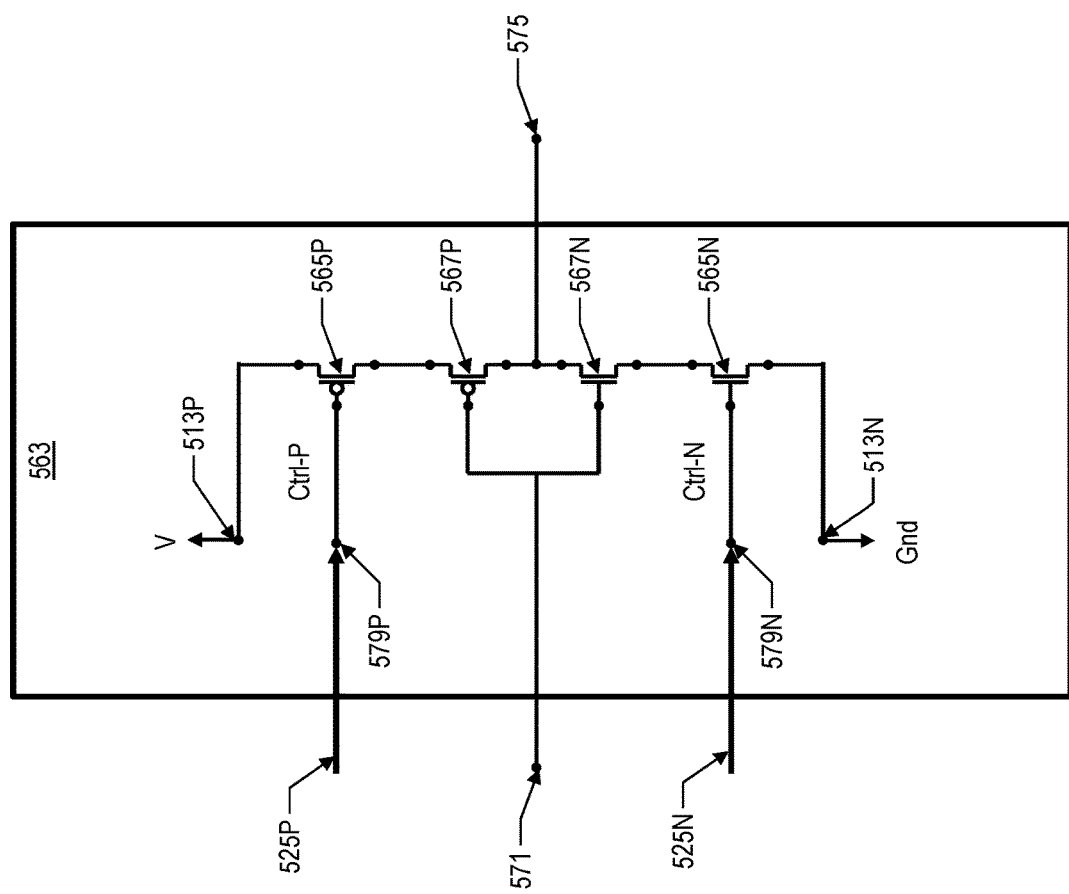
FIG. 8 shows an exemplary current-starved inverter in accordance with aspects of the invention.

FIG. 8 shows an example of a current-starved inverter 563 in accordance with aspects of the invention. In embodiments, the current-starved inverter 563 includes PFET 565P, PFET 567P and complementary NFET 565N and NFET 567N, which are configured as an inverter device. An input node 571 receives an input logic signal. For example, in accordance with aspects of the invention, the input node 507 can receive an input signal from, for example, an output of one or more of the inverters (e.g., oscillator elements 559) of a ring oscillator (e.g., ring oscillator array 555). PFET 567P and complementary NFET 567N are configured as an inverter having an output node 575 that outputs an output logic signal that is the inverse of the input logic signal.

There is a delay between the time the input received at the input node 571 changes state (e.g., from low logic to high logic) and the time at which the output at the output node 575 changes state (e.g., from high logic to low logic). In accordance with aspects of the invention, the delay modifies in proportion to the analog tuning signal 525. In embodiments, the voltage-starved inverter 559 receives analog tuning signal 525, which modifies that delay. For example, a control node 579P receives analog tuning signal 525P, which is the same as the analog tuning signal 525, but inverted, and control node 579N receives analog tuning signal 525N, which is the same as analog tuning signal 525. Control nodes 579P and 579N supply analog tuning signal 525P and 525N to the gates of PFET 565P and NFET 565N, respectively. Because the voltage provided to the bases of PFET 565P and NFET 565N changes due to variations in the analog tuning signal 525, the current passing through PFET 563P and NFET 563 from their voltage supplies (V, Gnd) varies based on the analog tuning signal 525. When the analog tuning signal 525 decreases, it "starves" the current provided to 567P and 567N, which modifies delay of the current-starved inverter 563 in accordance with aspects of the invention.

Figure 9:
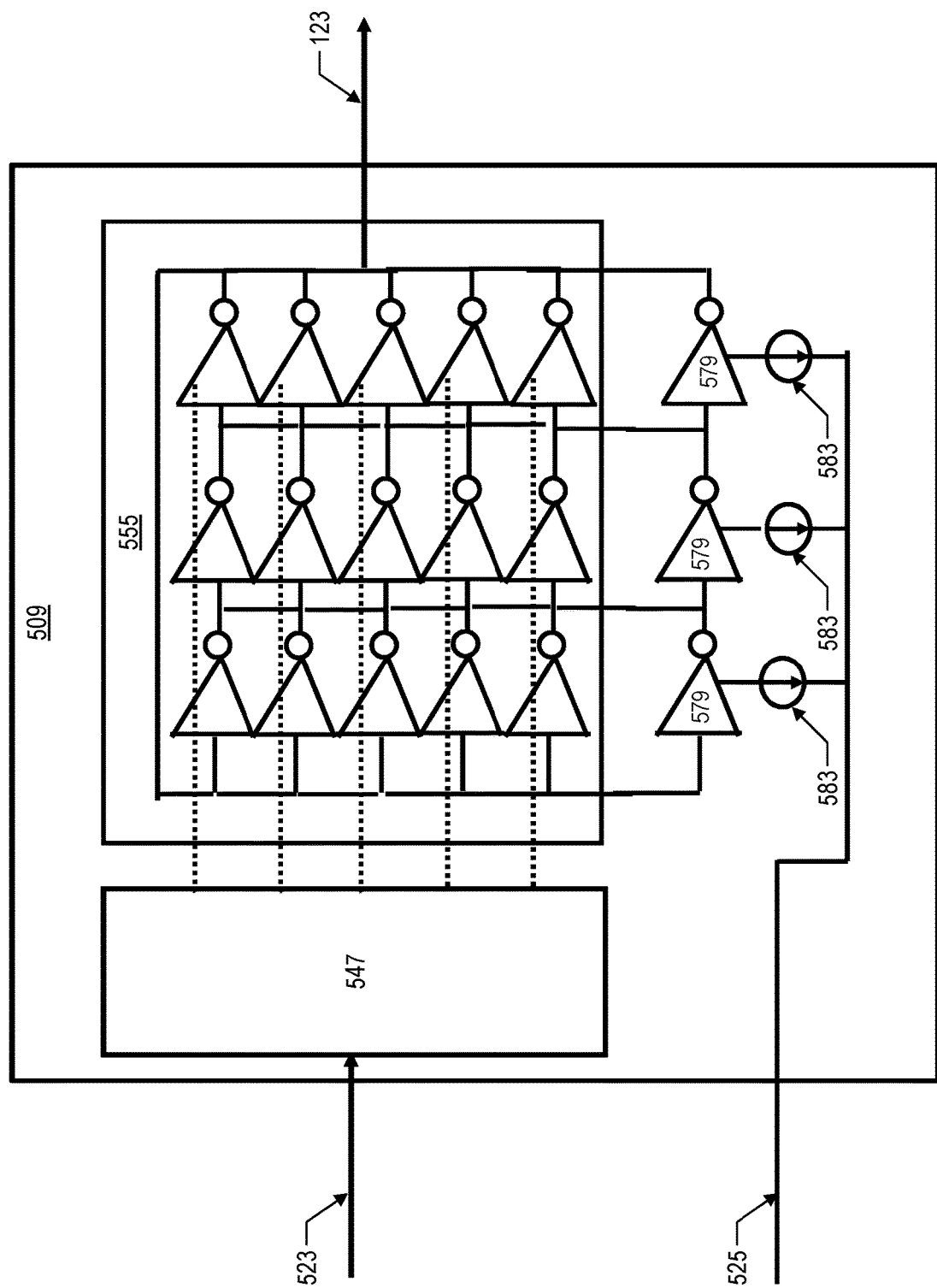
FIG. 9 shows an exemplary ring oscillator circuit in accordance with aspects of the invention.

FIG. 9 illustrates a hybrid ring oscillator circuit 509 in accordance with aspects of the invention. In embodiments, the hybrid ring oscillator circuit 509 includes the digital control logic 547, the ring oscillator array 555, and current-starved inverters 579. The digital control logic 547 and ring oscillator 555 may be the same or similar to those FIG. 6.

In accordance with aspects of the invention, the current-starved inverters 579 modify the oscillation frequency of the ring oscillator 509 based on the analog tuning signal 525. In embodiments, the analog tuning signal 525 provides a supply voltage to the voltage-controlled current sources 583 that modifies the supply current of the current-starved inverters 579 in relation to the voltage of the analog tuning signal 525. In accordance with aspects of the invention, the analog tuning signal 525 provides a supply voltage to the current sources 583, which modifies the current drawn from supply lines of the current-starved inverters 579 to starve their current and, thereby, modify their delay to modify frequency of output 123.

In accordance with aspects of the invention, the digital tuning signal 523 and the analog tuning signal 525 modify the frequency of the output 123 of the ring oscillator array 555 simultaneously. As the proportional input 525 increases, the frequency of the ring oscillator array 555 increases substantially linearly due to the increased output of the current-starved inverters 579. Additionally, as the digital tuning signal 523 increases, the fill factor increases the frequency of the ring oscillator array 555 higher/lower proportionally.

Figure 10:
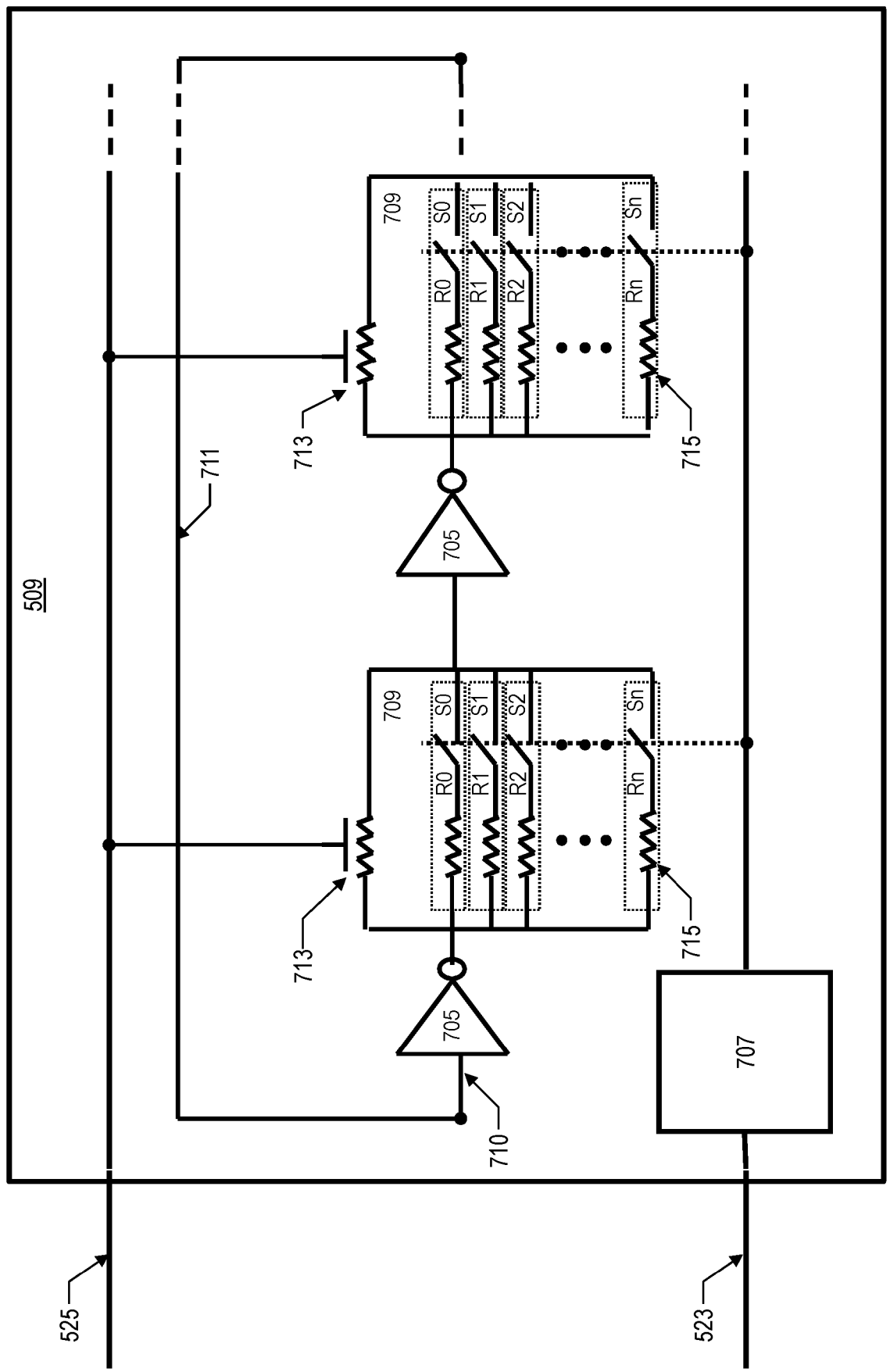
FIG. 10 shows an exemplary ring oscillator circuit in accordance with aspects of the invention.

FIG. 10 shows a ring oscillator circuit 509 in accordance with aspects of the invention. The ring oscillator 509 includes oscillator elements 705, digital control logic 707, and resistor devices 709 arranged in series along a forward path 710. In embodiments, each oscillator element 705 has a respective resistor device 709 connected at its output. A feedback path 711 connects the output of the last element in the forward path 710 to the input of the first element of the forward path 710. For example, the output of the last resistor device 707 in the forward path 710 to the input of the first oscillator element 705 in the forward path 710. For the sake of simplicity, two pairs of oscillator elements 705 and resistor devices 709 are shown in FIG. 10. However, the ring oscillator circuit 509 can include additional pairs of oscillator elements 705 and resistor devices 709.

In accordance with aspects of the invention, the digital tuning signal 523 and the analog tuning signal 525 modify the frequency of the ring oscillator array 509 simultaneously via the resistor devices 709. In embodiments, the resistor devices 709 include a voltage-controlled resistance element 713, and two or more switchable resistance elements 715 connected in parallel. By modifying the total resistance across the resistor devices 709 based on the digital tuning signal 523 and the analog tuning signal 525, the switching rate of the respective oscillator elements 705 is controlled to tune the oscillation frequency.

In accordance with aspects of the invention, the analog tuning signal 525 controls the oscillation frequency of the ring oscillator 509 by modifying the resistance of the voltage-controlled resistance elements 713. In embodiments, the voltage-controlled resistance elements 713 are configured to increase in resistance in proportion with the voltage of the analog tuning signal 525, which increase the total resistance across the resistor devices 709. In turn, the increased resistance causes a decrease in the switching frequency of the respective inverters 705, which slows the oscillation frequency of the ring oscillator 509.

Additionally, in accordance with aspects of the invention, the digital control logic 707 modifies the resistances of the resistor devices 709. In embodiments, each resistor device 709 includes a number of switchable resistance elements 715 connected in parallel, wherein digital control can be used to selectively switch on/off the switchable resistance elements 715. Thus, the by changing the number of switchable resistance elements 715 in the forward path 710, the total resistance of the switchable resistance elements 715 in each of the resistor devices 709 can be controlled. In embodiments, each of the switchable resistance elements 715 has the same resistance value such that, for each one added in parallel, the total resistance of the resistor device decreases. For example, resistors R0 . . . Rn can have the same resistance. Alternatively, each the switchable resistance elements 715 can have different a resistance value. For example, resistors R0 . . . Rn can have progressively greater resistance values.

In accordance with aspects of the invention, the digital control logic 707 selectively activates or deactivates the switchable resistor elements 715 based on the digital tuning signal 523. In embodiments, the digital control logic 707 is a device including hardware, software, or a combination thereof that determines whether to activate or deactivate individual ones of the switchable resistance elements 715 in the resistor devices 709. For example, the digital control logic 707 can include logic that interprets one or more digital logic signals in the digital tuning signal 523 and, based on the determination, selectively activates the switchable resistance elements 715. More specifically, embodiments of the digital control logic 707 can receive one or more values via the digital tuning signal 523 indicating a phase difference (e.g., between reference signal 115 and feedback signal 119) and selectively activate the switchable resistance elements 715 to increase or decrease the frequency of the ring oscillator 509 accordingly.

In embodiments, each resistor R0 . . . Rn in the resistor devices 709 is connected in series with a respective switch S0 . . . Sn that can be controlled to switch on/off by the digital control logic 707. For example, the switches S0 . . . Sn can have addresses by which they can be selectively activated/deactivated by the digital control logic 707. Thus, based on the digital tuning signal 523, the digital control logic 707 can selectively activate each resistor R0 . . . Rn to include them in the forward path 710. For example, the digital control logic 707 can selectively active the first two resistor elements R0 and R1 and selectively deactivate resistors R2 . . . Rn in each resistor device 709 using their respective switches S0 . . . Sn.

By modifying the resistance of the ring oscillator circuit 509, the analog tuning signal 525 and the digital tuning signal 523 modify the frequency of oscillation. That is, the lower the resistance, the faster the oscillation. As such, by including more switchable resistor elements 715 in the path, the frequency of the ring oscillator circuit increases. The switchable resistance elements 715, which include resistors 717 and switches 719, are exemplary. One or more other elements (e.g., transistors) that provide the same functionality can be used instead of resistors 717 and switches 719.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
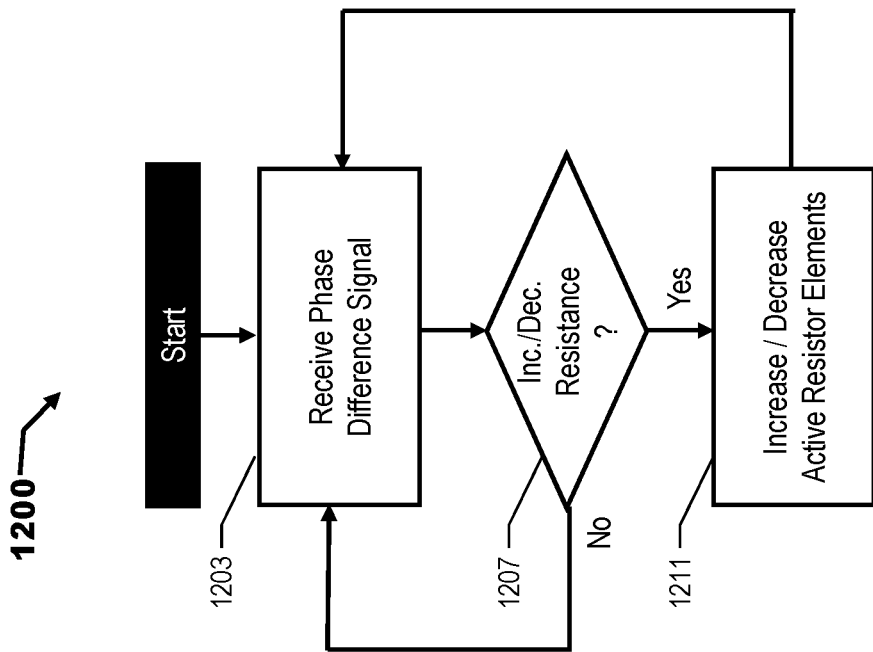
FIG. 12 shows an exemplary process flow in accordance with aspects of the invention.
Figure 11:
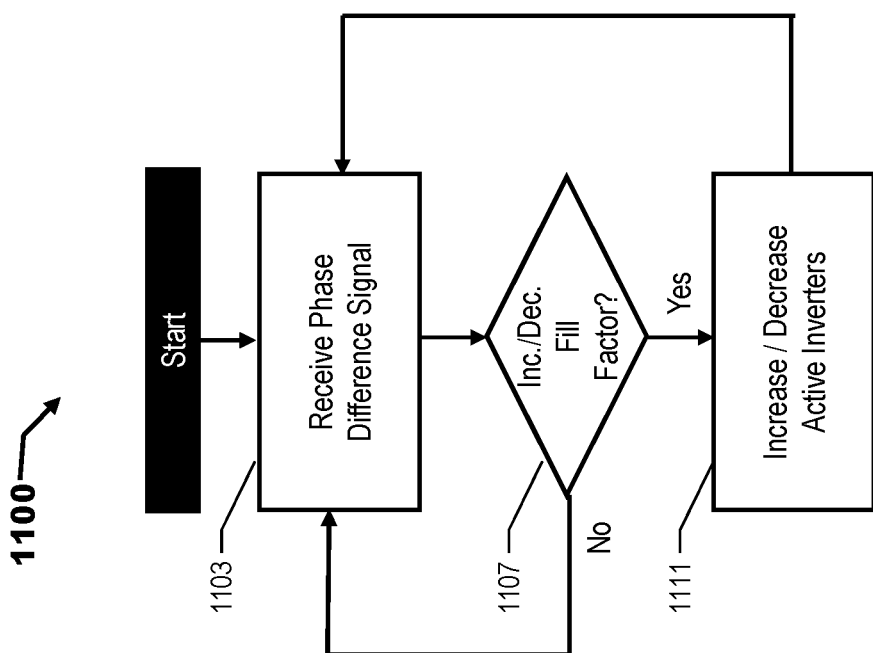
FIG. 11 shows an exemplary process flow in accordance with aspects of the invention.

FIGS. 11 and 12 show exemplary process flows for performing aspects of the present invention. The steps of FIGS. 11 and 12 can be implemented in the circuits of FIGS. 3-10.

The flowcharts in FIGS. 11 and 12 illustrate the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 11 depicts an exemplary flow of a process 1100 for controlling the oscillation frequency of a ring oscillator (e.g., hybrid ring oscillators 311 and 509) in accordance with embodiments of the invention. In embodiments, a hybrid ring oscillator circuit (e.g., hybrid ring oscillator circuits 300 and 500) can include a digital path (e.g., digital paths 117 and 501), an analog path (e.g., analog paths 305 and 503), and a feedback path (e.g., feedback paths 127 and 505) that modify the oscillation frequency of a ring oscillator array (e.g., ring oscillator arrays 317 and 555) based on a phase difference signal. As detailed previously, the digital path provides a digital phase difference signal (e.g., digital tuning signal 523) whose voltage indicates whether a reference signal (e.g., reference signal 115) leads or lags a feedback signal (e.g., feedback signal 119) from the feedback path. The analog path provides an analog phase difference signal (e.g., analog tuning signal 525) whose voltage also indicates whether a reference signal (e.g., reference signal 115) leads or lags a feedback signal (e.g., feedback signal 119) from the feedback path.

In accordance with aspects of the invention, control logic (e.g., analog control logic 313 or digital control logic 547) actively controls a fill factor of the ring oscillator array based on the phase difference signal. In embodiments, the control logic (e.g., analog control logic 313) controls the fill factor based on the analog phase difference signal. In other embodiments, the control logic (e.g., integral digital logic bus 547) controls the fill factor based on the digital phase difference signal. After the process 1100 starts, at step 1103, the control logic receives the phase difference signal. At step 1107, the device and/or software determine whether to increase or decrease the fill factor of the ring oscillator array based on the phase difference signal received at step 1103. For example, the control logic can compare the phase difference signal to one or more predetermined value stored in a memory device (e.g., a lookup table). Based on the comparison, the control logic determines whether to increase or decrease a current fill factor of the ring oscillator array. For example, if the control logic determines that the phase difference signal is less than a first threshold value, then the control logic can increase the fill factor to increase the oscillation frequency of the ring oscillator array. If the control logic determines that the phase difference is greater than a second threshold value, then the control log can decrease the oscillation frequency of the ring oscillator array. If the control logic determines that the phase difference is between the first and second threshold values, then it can determine not to change the oscillation frequency.

If the control logic determines not to change the oscillation frequency at step 1107 (i.e., "No"), then the process 1100 iteratively returns to step 1103 without changing the oscillation frequency of the ring oscillator array. If the control logic determines to change the oscillation frequency at step 1107 (i.e., "Yes"), then the process 1100 increases/decreases the number of active oscillation elements (e.g., oscillation elements 319 and 559) in the ring oscillator array at step 1111. For example, the ring oscillator array progressively activates/deactivates inverters in the ring oscillator array to increase/decrease the oscillation frequency, respectively. In embodiments, the fill factor is increased or decreased by activating or deactivating one or more rows of inverters (e.g., oscillator elements 559) in the ring oscillator array. For example, a first row of inverters can be active if the feedback signal lags the reference signal to increase the fill factor and, accordingly, the oscillation frequency. If the first row is already active, then next row can be activated. Subsequently, the process 1100 iteratively returns to step 1103.

FIG. 12 depicts an exemplary flow of a process 1200 for controlling an oscillation frequency of a ring oscillator (e.g., ring oscillator 509) in accordance with embodiments of the invention. In embodiments, a hybrid ring oscillator circuit (e.g., hybrid ring oscillator circuit 500) can include a digital path (e.g., digital path 501), an analog path (e.g., analog path 503), and a feedback path (e.g., feedback path 505) that modify the oscillation frequency of the ring oscillator based on a phase difference signal. In accordance with aspects of the invention, control logic (e.g., digital control logic 707) modifies the resistance in a forward path (e.g., forward path 710) of the ring oscillator based on the phase difference signal. In embodiments, the control logic modifies the resistance based on the digital phase difference signal. After the process 1200 starts, at step 1203, the control logic receives the phase difference signal. At step 1207, the device and/or software determine whether to increase or decrease the resistance of the ring oscillator based on the phase difference signal received at step 1203. For example, the control logic can compare the phase difference signal to one or more predetermined value stored in a memory device (e.g., a lookup table). Based on the comparison, the control logic determines whether to increase or decrease a current resistance of resistor devices (e.g., resistor devices 709) in the ring oscillator. For example, if the control logic determines that the phase difference signal is less than a first threshold value, then the control logic can decrease the total resistance of the resistor devices to increase the oscillation frequency of oscillation elements (e.g., oscillation elements 705) in the ring oscillator. If the control logic determines that the phase difference signal is greater than a first threshold value, then the control logic can increase the total resistance of the resistor devices to decrease the oscillation frequency of oscillation elements in the ring oscillator. If the control logic determines that the phase difference is between the first and second threshold values, then it can determine not to change the oscillation frequency.

If the control logic determines not to change the current resistance at step 1207 (i.e., "No"), then the process 1200 iteratively returns to step 1203 without changing the oscillation frequency of the ring oscillator. If the control logic determines to change the current resistance at step 1207 (i.e., "Yes"), then the process 1200 increases/decreases the resistance of the resistor devices included in the forward path of the ring oscillator at step 1211. For example, the control logic progressively activates/deactivates resistor elements (e.g., resistor elements R0 . . . Rn) using by activating/deactivating switches (e.g., switch elements S0 . . . Sn) in the ring oscillator to increase/decrease the oscillation frequency, respectively. Subsequently, the process 1100 iteratively returns to step 1103.

Figure 13:
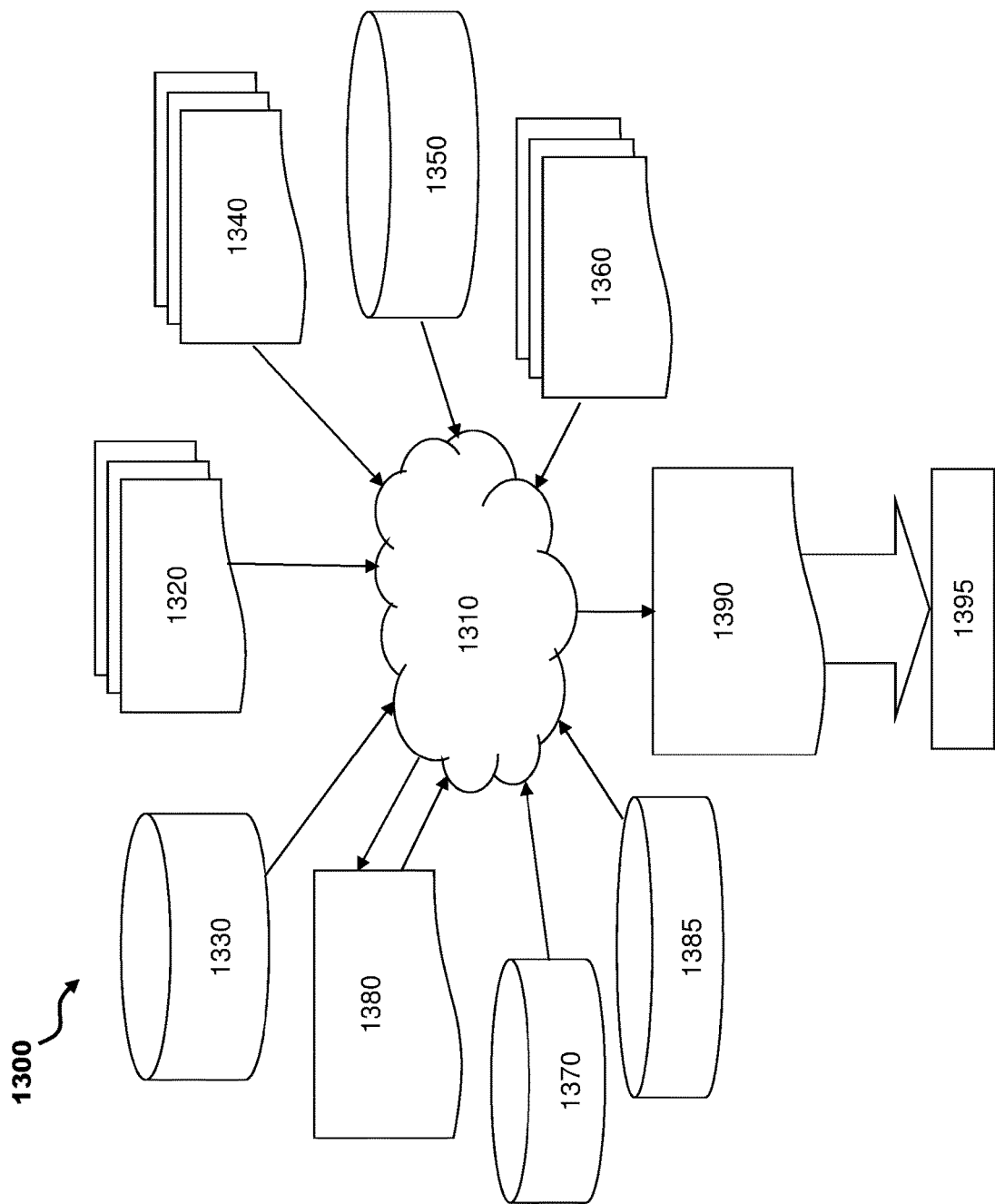
FIG. 13 shows a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 1300 used for example, in semiconductor IC logic design, simulation, test, layout, and manufacture. Design flow 1300 includes processes, machines and/or mechanisms for processing design structures or devices to generate logically or otherwise functionally equivalent representations of the design structures and/or devices described above and shown in FIGS. 3-10. The design structures processed and/or generated by design flow 1300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 1300 may modify depending on the type of representation being designed. For example, a design flow 1300 for building an application specific IC (ASIC) may differ from a design flow 1300 for designing a standard component or from a design flow 1300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 1320 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission, gate array, or storage medium, design structure 1320 may be accessed and processed by one or more hardware and/or software modules within design process 1310 to simulate or otherwise functionally represent an electronic component, circuit, electronic or logic module, apparatus, device, or system such as those shown in FIGS. 3-10. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown in FIGS. 3-10 to generate a netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1370, design rules 1370, and test data files 1385 which may include input test patterns, output test results, and other testing information. Design process 1310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1310 without deviating from the scope and spirit of the invention. Design process 1310 may also include modules for performing standard circuit design processes such as timing analysis, verification, design rule checking, place and route operations, etc.

Design process 1310 employs and incorporates logic and physical design tools such as HDL compilers and simulation model build tools to process design structure 1320 together with some or all of the depicted supporting data structures along with any additional mechanical design or data (if applicable), to generate a second design structure 1390.

Design structure 1390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-10. In one embodiment, design structure 1390 may comprise a compiled, executable HDL simulation model that functionally simulates the devices shown in FIGS. 3-10.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-10. Design structure 1390 may then proceed to a stage 1395 where, for example, design structure 1390: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a digital tuning signal being outputted into a ring oscillator array comprising oscillator elements in a plurality of rows each in electrical connection with one another;
   an analog tuning signal being outputted into the ring oscillator array, wherein the digital tuning signal and the analog tuning signal modify a frequency of the output of the ring oscillator array simultaneously by increasing a voltage of the analog tuning signal to provide a corresponding shift in the frequency of the output of the ring oscillator and increasing the frequency of the output of the ring oscillator linearly at any voltage of the digital tuning signal; and an analog control logic converting the analog tuning signal into a plurality of control signals going into select rows of the plurality of rows for selective control of the oscillator elements, wherein a first control signal of the plurality of control signals selectively activates and deactivates a first row of the oscillator elements to modify the frequency of the output of the ring oscillator array, and a second control signal of the plurality of control signals selectively activates and deactivates a second row of the oscillator elements to modify the frequency of the output of the ring oscillator array; and a fill factor which is a ratio of active oscillator elements in the ring oscillator array to a total number of the oscillator elements in the ring oscillator array, wherein the ring oscillator includes a plurality of varactors and the analog control logic changes the fill factor by activating the first row of oscillator elements and deactivating the second row of oscillator elements, the analog tuning signal is part of an analog path which includes a linear phase detector and a proportional gain device, the linear phase detector determines whether a reference signal leads or lags a feedback signal, and based on the determination, the linear phase detector generates one or more outputs that are proportional to a phase difference, the proportional gain device receives an output from the linear phase detector and generates the analog tuning signal having a voltage that is proportional to the phase difference between the reference signal and the feedback signal, the analog control logic determines the first control signal and the second control signal based on an analog tuning voltage, the oscillator elements are further configured in columns, and the analog tuning voltage is outputted by the linear phase detector.

2. The phase locked loop circuit of claim 1, further comprising a feedback path directly connecting an output of the ring oscillator array to the analog path.

3. The phase locked loop circuit of claim 2, wherein the linear phase detector determines whether the reference signal leads or lags the feedback signal from the feedback path.

4. The phase locked loop circuit of claim 3, wherein based on the determination that the reference signal leads or lags the feedback signal, the linear phase detector generates the one or more outputs proportional to the phase difference between the reference signal and the feedback signal.

5. The phase locked loop circuit of claim 1, wherein the oscillator elements are current-starved inverters.

6. The phase locked loop circuit of claim 5, wherein the current-starved inverters continuously modify an oscillation frequency of the output of the ring oscillator array based on the analog tuning signal.

7. The phase locked loop circuit of claim 6, wherein as the analog tuning signal decreases, output voltages of the current-starved inverters decrease proportionally, which reduces a frequency of the output of the ring oscillator array.

8. The phase locked loop circuit of claim 1, wherein the oscillator elements are configured in rows and columns.

9. The phase locked loop circuit of claim 8, wherein the oscillator elements are inverters.

10. The phase locked loop circuit of claim 9, wherein the oscillator elements are stacked inverters.

11. The phase locked loop circuit of claim 10, wherein the digital tuning signal is outputted into an input of the ring oscillator array and the analog tuning signal is outputted into a different input of the ring oscillator array.

\* \* \* \* \*